US012745501B2

(12) United States Patent
Yi et al.

(10) Patent No.: US 12,745,501 B2
(45) Date of Patent: Sep. 22, 2026

(54) DISPLAY DEVICE INCLUDING LIGHT-EMITTING ELEMENTS WITH CONDUCTIVE SEMICONDUCTOR RODS

(71) Applicant: LG Display Co., Ltd., Seoul (KR)

(72) Inventors: Hyo Jong Yi, Paju-si (KR); Chong Hwon Lee, Paju-si (KR); Seung Hyun Lee, Paju-si (KR); Hoon Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 357 days.

(21) Appl. No.: 18/516,536

(22) Filed: Nov. 21, 2023

(65) Prior Publication Data

US 2024/0186364 A1 Jun. 6, 2024

(30) Foreign Application Priority Data

Dec. 6, 2022 (KR) ........................ 10-2022-0168731

(51) Int. Cl.
*H10H 29/14* (2025.01)

(52) U.S. Cl.
CPC ................................ *H10H 29/142* (2025.01)

(58) Field of Classification Search
CPC .. H10H 29/142; H10H 20/857; H10H 20/821; H10H 20/83; H10H 20/84; H01L 25/0753; H10K 59/124; H10K 59/126; H10K 59/131; H10K 59/38; H10K 59/8792; H10D 86/441; H10D 86/451
USPC .......................................................... 257/88
See application file for complete search history.

(56) References Cited

U.S. PATENT DOCUMENTS

| | | | | |
|---|---|---|---|---|
| 9,425,355 | B2 | 8/2016 | Yoo et al. | |
| 11,730,037 | B2 | 8/2023 | Yoon et al. | |
| 2014/0217357 | A1* | 8/2014 | Yoo | H10H 20/821 257/13 |
| 2021/0391390 | A1 | 12/2021 | Yoon et al. | |
| 2022/0093678 | A1* | 3/2022 | Lee | H01L 25/0753 |
| 2022/0173160 | A1* | 6/2022 | Pak | H10H 20/821 |

FOREIGN PATENT DOCUMENTS

| | | |
|---|---|---|
| KR | 10-2014-0099803 A | 8/2014 |
| KR | 10-2021-0155037 A | 12/2021 |
| KR | 10-2022-0040576 A | 3/2022 |
| KR | 10-2022-0075585 A | 6/2022 |

OTHER PUBLICATIONS

Korean Intellectual Property Office, Office Action, KR Patent Application No. 10-2022-0168731, Nov. 6, 2025, 14 pages.

* cited by examiner

*Primary Examiner* — Mohammad M Hoque
(74) *Attorney, Agent, or Firm* — Fenwick & West LLP

(57) ABSTRACT

A display device is disclosed that includes a substrate, a light-emitting element disposed on the substrate, a first insulating layer disposed on the light-emitting element, and a driving element disposed on the first insulating layer, wherein the driving element passes through the first insulating layer and is electrically connected to the light-emitting element.

14 Claims, 10 Drawing Sheets

DISPLAY DEVICE INCLUDING LIGHT-EMITTING ELEMENTS WITH CONDUCTIVE SEMICONDUCTOR RODS

CROSS-REFERENCE TO RELATED APPLICATION

This application claims priority to and the benefit of Republic of Korea Patent Application No. 10-2022-0168731, filed on Dec. 6, 2022, which is hereby incorporated by reference in its entirety.

BACKGROUND

1. Field of Technology

The embodiments described herein relate to a display device.

2. Discussion of Related Art

Electroluminescence display devices are classified into inorganic light-emitting display devices and organic light-emitting display devices depending on materials of a light-emitting layer. An active-matrix-type organic light-emitting display device includes an organic light-emitting diode (OLED) that emits light by itself and has advantages in terms of a quick response time, high luminous efficiency, high luminance, and a wide viewing angle.

In an organic light-emitting display device, an OLED is formed in each of pixels. The organic light-emitting display device may represent a black grayscale as perfect black as well as having a quick response time, high luminous efficiency, high luminance, and a wide viewing angle, and thus has an excellent contrast ratio and color gamut.

However, the organic light-emitting display device has problems in that an organic light-emitting element is vulnerable to moisture and thus a lifespan is relatively short, luminance of the organic light-emitting element is limited, pure-color luminance becomes lower due to the use of white color, an aperture ratio is limited, and an expensive polarizing plate is required.

SUMMARY

The embodiments described herein disclose a display device using an inorganic light-emitting element.

It should be noted that the object of the present disclosure is not limited to the above-described object, and other objects of the present disclosure will be apparent to those skilled in the art from the following descriptions.

A display device according to an aspect of the present disclosure includes a substrate, a light-emitting element disposed on the substrate, a first insulating layer disposed on the light-emitting element, and a driving element disposed on the first insulating layer, wherein the driving element passes through the first insulating layer and is electrically connected to the light-emitting element.

The light-emitting element may include a first electrode layer disposed on the substrate, a seed semiconductor layer disposed on the first electrode layer, a pattern insulating film disposed on the seed semiconductor layer and including a plurality of through holes, a plurality of first conductive semiconductor rods grown in the plurality of through holes, respectively, an activation layer disposed on the plurality of first conductive semiconductor rods, a second conductive semiconductor layer disposed on the activation layer, and a second electrode layer disposed on the second conductive semiconductor layer.

The driving element may include an active layer disposed on the first insulating layer, and a first line electrode and a second line electrode that are connected to the active layer, wherein the second line electrode may pass through the first insulating layer and may be electrically connected to the second electrode layer of the light-emitting element.

The active layer may be disposed to be higher than the activation layer.

The display device may include a light-blocking layer disposed between the first insulating layer and the active layer.

The display device may include a light-blocking layer disposed below the active layer, wherein the light-blocking layer may be disposed on the same layer as the first electrode layer.

The second line electrode may be electrically connected to the light-blocking layer.

The display device may include a second insulating layer disposed on the driving element, and a light conversion layer disposed on the second insulating layer, wherein the light conversion layer may be disposed above the light-emitting element to overlap the light-emitting element.

The light-emitting element may be disposed at a lower position than the driving element, and the light conversion layer may be disposed at a higher position than the driving element.

The display device may include a connection channel that passes through the first insulating layer to electrically connect the first electrode layer to a low-potential line.

The display device may further comprises a color filter disposed on the light conversion layer, a third insulting layer disposed on the color filter, and a black matrix disposed on the third insulting layer, and wherein the remaining area except for an opening area from which a light is emitted by the light-emitting element is covered by the black matrix.

A display device according to another aspect of the present disclosure includes a substrate, a light-emitting element disposed on the substrate, a first insulating layer disposed on the light-emitting element, a driving element disposed on the first insulating layer, a second insulating layer disposed on the driving element, and a light conversion layer disposed on the second insulating layer, wherein the light conversion layer is disposed to overlap the light-emitting element.

The light-emitting element may include a first electrode layer disposed on the substrate, a seed semiconductor layer disposed on the first electrode layer, a pattern insulating film disposed on the seed semiconductor layer and including a plurality of through holes, a plurality of first conductive semiconductor rods grown in the plurality of through holes, respectively, an activation layer formed on the plurality of first conductive semiconductor rods, a second conductive semiconductor layer disposed on the activation layer, and a second electrode layer disposed on the second conductive semiconductor layer.

The driving element may include an active layer disposed on the first insulating layer, and a first line electrode and a second line electrode that are connected to the active layer, wherein the second line electrode may pass through the first insulating layer and may be electrically connected to a second electrode layer of the light-emitting element.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION

Figure 1:
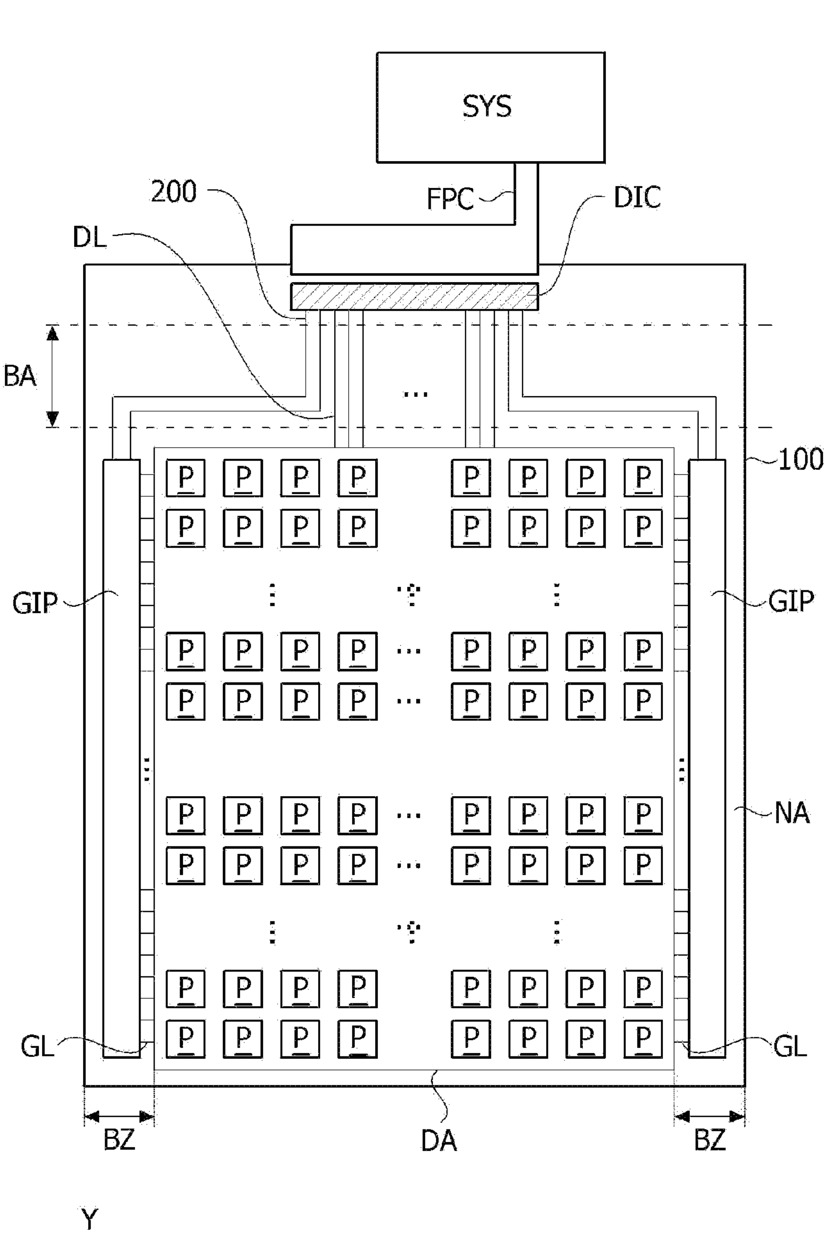
FIG. 1 is a conceptual diagram of a display device according to one embodiment of the present disclosure.
Figure 1:
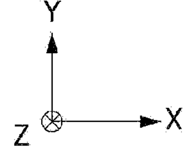

Advantages and features of the present disclosure and implementation methods thereof will be clarified through the following embodiments described with reference to the accompanying drawings. However, the present disclosure is not limited to the embodiments described below and may be implemented with a variety of different forms. The embodiments are merely provided to allow those skilled in the art to completely understand the scope of the present disclosure, and the present disclosure is defined only by the scope of the claims.

The figures, dimensions, ratios, angles, numbers, and the like disclosed in the drawings for describing the embodiments of the present disclosure are merely illustrative and are not limited to details shown in the present disclosure. Throughout the specification, like reference numerals refer to like elements. Further, in describing the present disclosure, detailed descriptions of well-known technologies will be omitted when it is determined that they may unnecessarily obscure the gist of the present disclosure.

Terms such as "including," "having," and "composed of" used herein are intended to allow other elements to be added unless the terms are used with the term "only." Any references to the singular may include the plural unless expressly stated otherwise.

Components are interpreted as including an ordinary error range even if not expressly stated.

For description of a positional relationship, for example, when the positional relationship between two parts is described as "on," "above," "below," and "next to," or the like, one or more parts may be interposed therebetween unless the term "immediately" or "directly" is used in the expression.

In the description of embodiments, the terms "first," "second," and the like may be used herein to describe various components, the components are not limited by the terms. These terms are used only to distinguish one component from another. Accordingly, a first component described below could be termed a second component without departing from the technical spirit of the present disclosure.

Throughout the specification, like reference numerals refer to like elements.

The features of various embodiments may be partially or entirely combined with each other. The embodiments may be interoperated and performed in technically various ways and may be carried out independently of or in association with each other.

A pixel circuit and a gate driving unit formed on a display panel of the present disclosure may include a plurality of transistors. The transistors may be implemented as oxide thin-film transistors (TFTs) including an oxide semiconductor, low-temperature polysilicon (LTPS) TFTs including LTPS, and the like. In addition, each of the transistors may be implemented as a p-channel TFT or an n-channel TFT.

The transistor is a three-electrode element including a gate, a source, and a drain. Here, the source is an electrode that provides carriers to the transistor. In addition, the carriers in the transistor start to flow from the source. In addition, the drain is an electrode through which the carriers exit from the transistor to the outside. In addition, in the transistor, the carriers flow from the source to the drain. In the case of an n-channel transistor, carriers are electrons, and thus a source voltage is lower than a drain voltage so that the electrons flow from the source to the drain. In this case, in the n-channel transistor, current flows from the drain to the source. In the case of a p-channel transistor (PMOS), carriers are holes, and thus a source voltage is higher than a drain voltage so that the holes flow from the source to the drain. In addition, in the p-channel transistor, since the holes flow from the source to the drain, current flows from the source to the drain. It should be noted that the source and the drain of the transistor are not fixed in position. For example, the source and the drain are interchangeable depending on the applied voltage. Accordingly, the present disclosure is not limited by the source and the drain of the transistor. In the following description, the source and the drain of the transistor will be referred to as a first electrode and a second electrode, respectively.

A gate signal swings between a gate-on voltage and a gate-off voltage. Here, the gate-on voltage is set to be higher than a threshold voltage of the transistor, and the gate-off voltage is set to be lower than the threshold voltage of the transistor. The transistor is turned on in response to the gate-on voltage and turned off in response to the gate-off voltage. In the case of an n-channel transistor, the gate-on voltage may be a gate high voltage VGH/VEH, and the gate-off voltage may be a gate low voltage VGL/VEL. In the case of a p-channel transistor, the gate-on voltage may be the gate low voltage VGL/VEL, and the gate-off voltage may be the gate high voltage VGH/VEH.

Hereinafter, various embodiments of the present disclosure will be described in detail with reference to the accompanying drawings.

FIG. 1 is a conceptual diagram of a display device according to one embodiment of the present disclosure.

Referring to FIG. 1, the display device according to one embodiment of the present disclosure may include a display panel 100 including a display area DA and a non-display area NA surrounding the display area DA, and a plurality of lines formed on the display panel 100.

A plurality of data lines DL, a plurality of gate lines GL crossing the plurality of data lines DL, and a plurality of pixels P arranged in a matrix form defined by the plurality of data lines DL and the plurality of gate lines GL may be disposed in the display area DA of the display panel 100. In addition, the display panel 100 may include a bezel area BZ that is the non-display area NA outside the display area DA.

Each of the pixels P includes sub-pixels having different colors for color implementation. The sub-pixels may include red (hereinafter referred to as "R sub-pixel"), green (hereinafter referred to as "G sub-pixel"), and blue (hereinafter referred to as "B sub-pixel"). Although not shown in the drawings, each of the pixels P may further include a white sub-pixel. Hereinafter, a pixel may be interpreted as a sub-pixel unless otherwise defined. Each of the sub-pixels may include a pixel circuit.

The pixel circuit may include a driving element configured to supply a current to a light-emitting element, one or more switch elements configured to switch current paths between the driving elements and the light-emitting element, a capacitor configured to maintain a gate-source voltage Vgs of the driving element, and the like.

A display panel driving unit DIC writes pixel data of an input image to the pixels P. The display panel driving unit DIC includes a data driving unit configured to supply a data voltage of the pixel data to the data lines DL and a gate driving unit GIP (e.g., a circuit) configured to sequentially supply a gate pulse to the gate lines GL. The data driving unit may be integrated in the display panel driving unit DIC. The display panel driving unit DIC (e.g., a circuit) may be adhered to the display panel 100.

The display panel driving unit DIC is connected to the data lines DL through data output channels to supply a voltage of a data signal to the data lines. The display panel driving unit DIC includes a timing controller. The timing controller transmits pixel data of an input image received from a host system SYS to the data driving unit, and controls operation timings of the data driving unit and the gate driving unit GIP.

The data driving unit of the display panel driving unit DIC converts the pixel data into a gamma compensation voltage through a digital-to-analog converter (DAC) and outputs a data voltage.

The gate driving unit GIP may include a shift register formed on a circuit layer of the display panel 100 together with a pixel array. The shift register of the gate driving unit GIP sequentially supplies the gate signal to the gate lines GL under the control of the timing controller. The gate signal may include a scan pulse and an emission control pulse (hereinafter, referred to as an "EM pulse"). The shift register may include a scan driving unit configured to output the scan pulse, and an EM driving unit configured to output the EM pulse.

The host system SYS may be implemented as an application processor (AP). The host system SYS transmits pixel data of an input image to the display panel driving unit DIC. The host system SYS may be connected to the display panel driving unit DIC through, for example, a flexible printed circuit (FPC). Here, the flexible printed circuit may be formed on a flexible printed circuit board.

The display panel driving unit DIC is exemplified as being disposed on the display panel 100, but the present disclosure is not necessarily limited thereto. For example, the display panel driving unit DIC mounted on a flexible printed circuit board may be electrically connected to the display panel 100. The flexible circuit board may be adhered to the display panel 100 by a bonding process in a state in which an anisotropic conductive film (ACF) is aligned in an area, in which the flexible circuit board is bonded, in the display panel 100.

Figure 2:
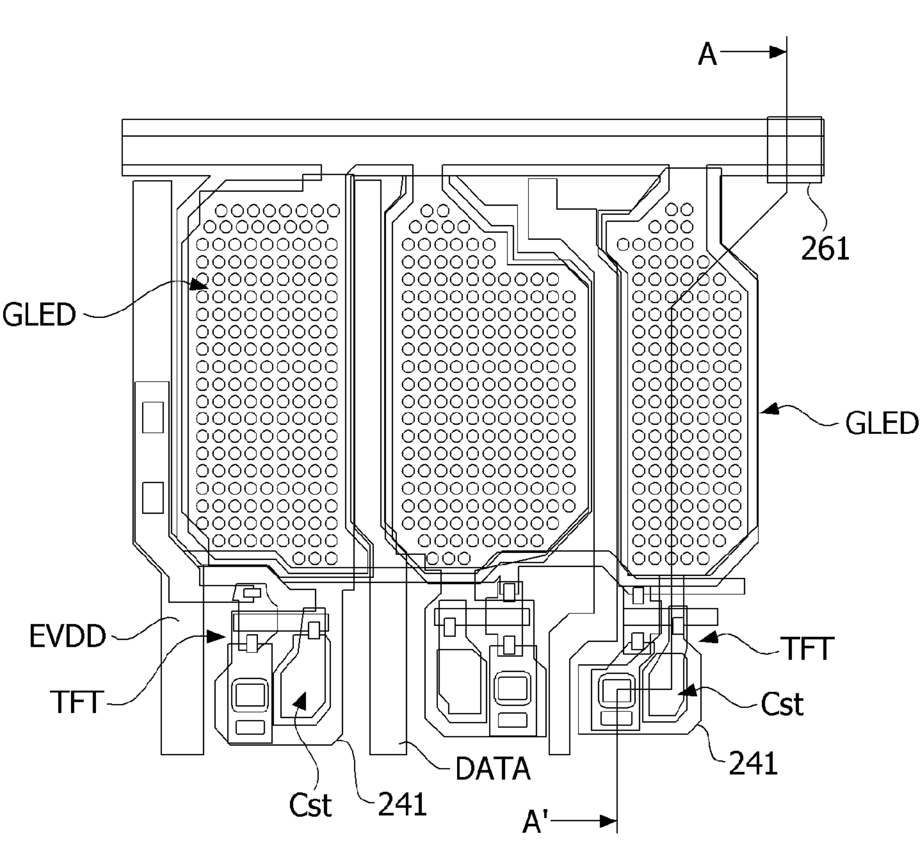
FIG. 2 is a plan view of a pixel structure according to one embodiment of the present disclosure.
Figure 3:
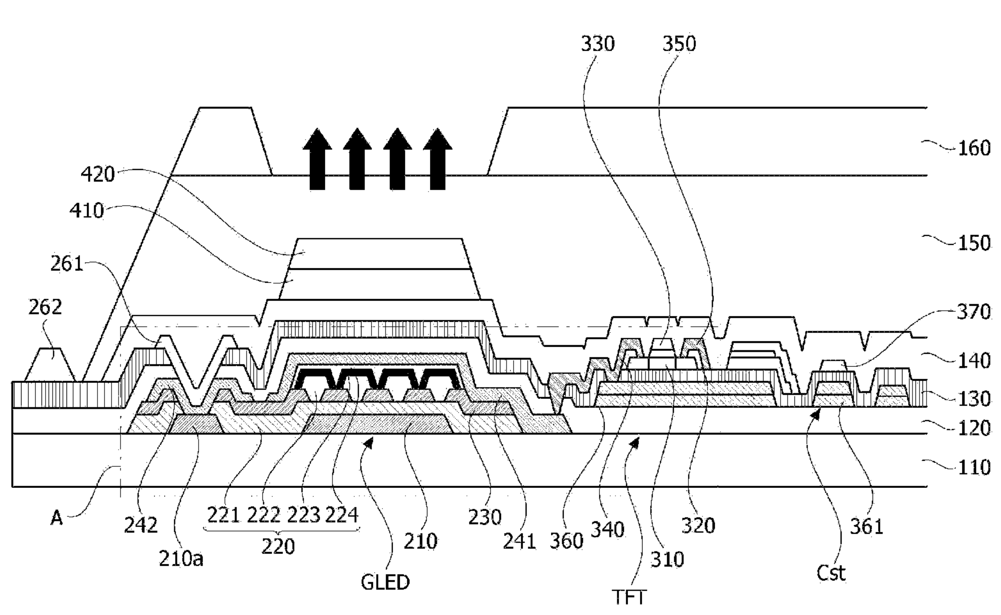
FIG. 3 is a cross-sectional view taken along line A-A' of FIG. 2 according to one embodiment of the present disclosure.
Figure 4:
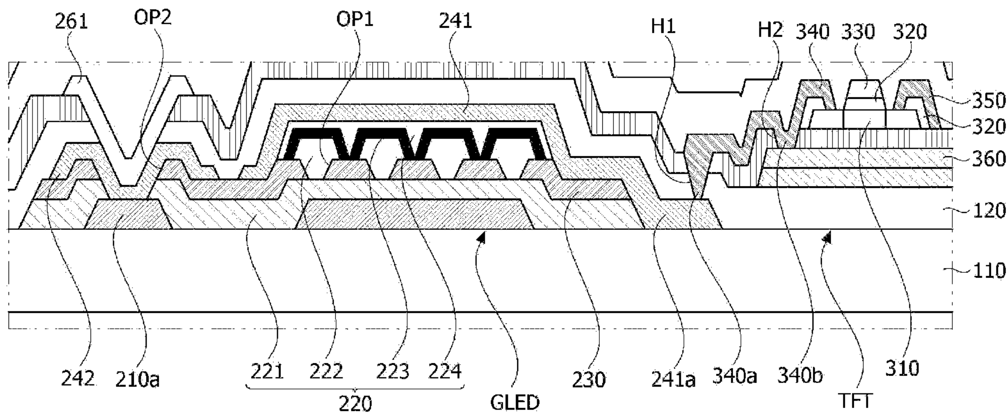
FIG. 4 is an enlarged view of portion A of FIG. 3 according to one embodiment of the present disclosure.

FIG. 2 is a plan view of a pixel structure according to one embodiment of the present disclosure. FIG. 3 is a cross-sectional view taken along line A-A' of FIG. 2 according to one embodiment of the present disclosure. FIG. 4 is an enlarged view of portion A of FIG. 3 according to one embodiment of the present disclosure.

Referring to FIGS. 2 to 4, each pixel circuit may include a light-emitting element GLED disposed on a substrate 110, a first insulating layer 120 disposed on the light-emitting element GLED, and a driving element TFT disposed on the first insulating layer 120.

The substrate 110 may be a glass substrate, but is not necessarily limited thereto, and may be a rigid substrate having a predetermined strength. In addition, the substrate 110 may be a substrate made of a flexible material such as polyimide (PI).

A first electrode layer 210 may be formed on the substrate 110. The first electrode layer 210 may include metals of various materials on which a semiconductor can be grown. As an example, the first electrode layer 210 may be made of titanium (Ti), but metals of materials on which a semiconductor can be grown may be variously selected. When a thickness of the first electrode layer 210 ranges from 800 Å to 1500 Å, the thickness required for the semiconductor growth may be secured.

A seed semiconductor layer 221 may be epitaxially grown on the first electrode layer 210. A method of growing the seed semiconductor layer is not particularly limited. The seed semiconductor layer may be formed using a metal organic chemical vapor deposition (MOCVD) method, a chemical vapor deposition (CVD) method, a plasma chemical vapor deposition (PECVD) method, a molecular beam epitaxy (MBE) method, a hydride vapor phase epitaxy (HVPE) method, sputtering, and the like. The seed semiconductor layer 221 may be grown on an upper portion of the first electrode layer 210 or may extend to the outside of the first electrode layer 210 by the growth.

The seed semiconductor layer 221 may be made of a material selected from semiconductor materials having a composition formula of $In_xAl_yGa_{1-x-y}N$ ((<=x<=1, 0<=y<=1, and (<=x+y<=1), for example, a material selected from among GaN, AlGaN, InGaN, InAlGaN, and the like. The seed semiconductor layer 221 may be doped with an n-type dopant such as Si, Ge, Sn, Se, or Te, but the present disclosure is not limited thereto.

The seed semiconductor layer 221 may provide a growth surface on which first conductive semiconductor rods 222 to be described below can grow. In addition, the seed semiconductor layer 221 may have conductivity and thus electrically connect the first electrode layer 210 to a light-emitting structure 220.

A pattern insulating film 230 may be disposed on the seed semiconductor layer 221. The pattern insulating film 230 includes a plurality of first holes OP1 in which the first conductive semiconductor rods 222 can grow. The plurality of first holes OP1 may be formed by a mask pattern. The pattern insulating film 230 may include an insulating material such as $SiO_2$ or $SiN_x$, but the present disclosure is not limited thereto.

Each of the light-emitting structures 220 may include a plurality of first conductive semiconductor rods 222 grown on the seed semiconductor layer 221 through the first holes OP1, an activation layer 223 formed on the plurality of first conductive semiconductor rods 222, and a second conductive semiconductor layer 224 formed on the activation layer 223.

The plurality of first conductive semiconductor rods 222 may grow in the plurality of first holes OP1, respectively, in a substantially vertical direction and may each have a nano-sized diameter. The first conductive semiconductor rod 222 may extend to an upper surface of the pattern insulating film 230 after being grown in the first hole OP1.

A cross section of the first conductive semiconductor rod 222 may have a triangular shape, a quadrangular shape, a trapezoidal shape, or a pyramid shape. However, the shape of the first conductive semiconductor rod 222 is not particularly limited. The plurality of first conductive semiconductor rods 222 may be disposed to be spaced apart from each other, but are not necessarily limited thereto, and may form a single layer depending on growth conditions.

The first conductive semiconductor rod 222 may be a compound semiconductor such as a group III-V compound semiconductor, a group II-VI compound semiconductor, or the like, and may be doped with a first dopant.

The first conductive semiconductor rod 222 may be made of a material selected from semiconductor materials having a composition formula of $In_xAl_yGa_{1-x-y}N$ ((<=x<=1, 0<=y<=1, and (<=x+y<=1), for example, a material selected from among GaN, AlGaN, InGaN, InAlGaN, and the like. The first dopant may be an n-type dopant such as Si, Ge, Sn, Se, and Te. When the first dopant is an n-type dopant, the first conductive semiconductor rod 222 doped with the first dopant may be an n-type semiconductor.

The activation layer 223 is disposed on the first conductive semiconductor rod 222. Thus, the activation layer 223 may have a shape curved along an upper surface of the first conductive semiconductor rod 222. The activation layer 223 may be formed on each of the first conductive semiconductor rods 222 to be separated into a plurality of activation layers, or the activation layers 223 formed respectively on the plurality of first conductive semiconductor rods 222 may be connected to each other.

The activation layer 223 is a layer in which electrons (or holes) injected through the first conductive semiconductor rod 222 and holes (or electrons) injected through the second conductive semiconductor layer 224 meet. The activation layer 223 may transition to a low energy level due to the recombination of electrons and holes and emit light having a wavelength corresponding thereto. In the present embodiment, light of a blue wavelength band may be emitted, but the present disclosure is not necessarily limited thereto.

The activation layer 223 may have one structure among a single well structure, a multi-well structure, a single quantum well structure, a multi-quantum well (MQW) structure, a quantum dot structure, and a quantum wire structure, but the structure of the activation layer 223 is not limited thereto.

The activation layer 223 may have a structure in which a plurality of well layers and a plurality of barrier layers are alternately arranged. The well layer and the barrier layer may have a composition formula of $In_xAl_yGa_{1-x-y}N$ (0<=x<=1, 0<=y<=1, and (<=x+y<=1), and an energy band gap of the barrier layer may be greater than an energy band gap of the well layer.

The second conductive semiconductor layer 224 is disposed on the activation layer 223. The second conductive semiconductor layer 224 may be implemented with a compound semiconductor such as a group III-V compound semiconductor, a group II-VI compound semiconductor, or the like and may be doped with a second dopant.

The second conductive semiconductor layer 224 may be formed of a semiconductor material having a composition formula of $In_xAl_yGa_{1-x-y}N$ (0<=x<=1,0<=y<=1, and (<=x+y<=1), or a material selected from among GaN, AlGaN, InGaN, InAlGaN, and the like. When the second dopant is a p-type dopant such as Mg, Zn, Ca, Sr, Ba, or the like, the second conductive semiconductor layer 224 doped with the second dopant may be a p-type semiconductor.

An electron blocking layer (not shown) may be disposed between the activation layer 223 and the second conductive semiconductor layer 224. The electron blocking layer may be made of a material selected from semiconductor materials having a composition formula of $In_xAl_yGa_{1-x-y}N$ (0<=x<=1, 0<=y<=1, and (<=x+y<=1), for example, a material selected from among AlGaN, InGaN, InAlGaN, and the like, but the present disclosure is not limited thereto.

A second electrode layer 241 may be disposed on the light-emitting structure 220. The second electrode layer 241 may include a connection node 241*a* extending to a side surface of the light-emitting structure 220. The second electrode layer 241 may be a transparent electrode such as indium tin oxide (ITO), but the present disclosure is not necessarily limited thereto.

As an example, the second electrode layer 241 may be selected from ITO, indium zinc oxide (IZO), aluminum zinc oxide (AZO), aluminum gallium zinc oxide (AGZO), indium zinc tin oxide (IZTO), indium aluminum zinc oxide (IAZO), Indium Gallium Zinc Oxide (IGZO), indium gallium tin oxide (IGTO), antimony tin oxide (ATO), gallium zinc oxide (GZO), IZO Nitride (IZON), ZnO, IrOx, RuOx, NiO, and the like.

The light-emitting element GLED according to the embodiment may be a semiconductor element including an inorganic compound such as GaN, AlGaN, or the like. A light-emitting diode using a group III-V or group II-VI compound semiconductor material may realize various colors, such as red, green, blue, or ultraviolet rays due to the development of thin-film growth technology and device materials, may also realize efficient white light by using a fluorescent material or combining colors, and has the advantages of low power consumption, semi-permanent lifespan, quick response time, safety, and environmental friendliness. Thus, according to the embodiment, the disadvantages of the existing organic light-emitting element can be improved.

The first insulating layer 120 may entirely cover the light-emitting element GLED. The first insulating layer 120 may include an insulating material such as an oxide film ($SiO_2$) or a nitride film ($SIN_x$), or may be formed of a multi-layered insulating film in which two or more oxide films ($SiO_2$) and nitride films ($SIN_x$) are stacked. A thickness of the first insulating layer 120 is not particularly limited.

The driving element TFT may be disposed on the first insulating layer 120. Thus, the driving element TFT may be disposed at a higher position than the light-emitting element GLED. As the thickness of the first insulating layer 120 increases, the driving element TFT may be disposed to be higher than the light-emitting element GLED. As an example, an active layer 310 of the driving element TFT may be disposed to be higher than the activation layer 223 of the light-emitting element GLED. However, when the thickness of the first insulating layer 120 is relatively small, the height of the driving element TFT and the height of the light-emitting element GLED may be substantially the same.

The driving element TFT is formed after the manufacture of the light-emitting element GLED is completed, and thus the driving element TFT may be disposed on the first insulating layer 120. Since the light-emitting element according to the embodiment is an inorganic compound, the temperature of a manufacturing process may be relatively high. Accordingly, when the light-emitting element GLED is manufactured after the driving element TFT is first formed, the active layer 310 of the driving element TFT may be degraded by the high temperature.

A light-blocking layer 360 of the driving element TFT may be formed by patterning a metal layer by a photolithography process. The light-blocking layer 360 may block external light so that the light is not irradiated to the active layer 310 of the driving element TFT, thereby preventing a photo current from generating in a pixel area. In addition, the light-blocking layer 360 may be connected to a line electrode to serve as a line.

A first interlayer insulating film 130 may be formed on the light-emitting element GELD and the light-blocking layer 360. The first interlayer insulating film 130 may include an insulating material such as an oxide film ($SiO_2$) or a nitride film ($SIN_x$), or may be formed of a multi-layered insulating film in which two or more oxide films ($SiO_2$) and nitride films ($SIN_x$) are stacked.

The active layer 310 may be made of a semiconductor material formed on the first interlayer insulating film 130 and may be patterned by a photolithography process. The active layer 310 may include an active pattern of each of TFTs of the pixel circuit and TFTs of the gate driving unit. A portion of the active layer 310 may be metallized by ion doping. The metallized portion may be used as a jumper pattern connecting the metal layers at some nodes of the pixel circuit to connect components of the pixel circuit.

A gate insulating film 320 may be formed on the active layer 310. The gate insulating film 320 may be made of an inorganic insulating material.

A gate electrode 330 and an upper electrode 370 of a storage capacitor Cst may be formed on the gate insulating film 320. The gate electrode 330 and the like may be patterned by a photolithography process.

A second line electrode 340 and a first line electrode 350 may extend outwardly from the active layer 310. The second line electrode 340 may include a first through electrode **340*a* that passes through the first interlayer insulating film 130 and the first insulating layer 120 to be electrically connected to the second electrode layer 241 of the light-emitting element GLED. In addition, the second line electrode 340 may include a second through electrode 340*b* that passes through the first interlayer insulating film 130 to be electrically connected to the light-blocking layer 360. In this case, the light-blocking layer 360** may serve as a line at the same time.

The first electrode layer 210 of the light-emitting element GLED may be connected to a line 262 of a low-potential power voltage EVSS through a connection channel 261, and the second electrode layer 241 of the light-emitting element GLED may be connected to a line of a pixel driving voltage EVDD through the second line electrode 340. Thus, when the pixel driving voltage is applied through the driving element TFT, the light-emitting element GLED may emit light.

A second insulating layer 140 may be disposed on the driving element TFT, and a light conversion layer 410 may be disposed on the second insulating layer 140. The light conversion layer 410 according to the embodiment may include a fluorescent material capable of converting blue light emitted from the light-emitting element GLED into white light. As an example, the light conversion layer 410 may include a yttrium aluminum garnet (YAG) phosphor that converts blue light into white light, but is not necessarily limited thereto, and may include various fluorescent materials capable of converting emitted light into white light.

According to the embodiment, the light conversion layer 410 may be formed after the manufacture of the driving element TFT is completed. Fluorescence characteristics of the light conversion layer 410 may be deteriorated due to a high temperature generated when the inorganic layer is formed. Accordingly, by forming the light conversion layer 410 after the manufacture of the light-emitting element GLED and the driving element TFT is completed, the deterioration of the fluorescence characteristics may be prevented or at least reduced. Accordingly, since the fluorescence characteristics are not deteriorated, color conversion efficiency may be excellent.

A color filter 420 may be disposed on the light conversion layer 410. The color filter 420 may convert the white light converted by the light conversion layer 410 into red, green, or blue (RGB) light. As the configuration of the color filter 420, known configurations may be applied without limitation. As an example, the color filter includes a first pixel area that converts incident light into blue light, a second pixel area that converts incident light into green light, and a third pixel area that converts incident light into red light, and a black matrix is disposed between each pixel area to prevent color mixing.

A third insulating layer 150 may be disposed on the color filter 420 and planarized, and a black matrix 160 may be disposed on the third insulating layer 150. According to the embodiment, light generated from the light-emitting element GLED is converted into white color by the light conversion layer 410, and then is converted into a predetermined color by the color filter 420 to be emitted upward, and the remaining area except for an opening area from which the light is emitted is covered by the black matrix 160, so that visibility can be improved even without a separate color filter on encapsulation layer (CoE) or polarizer.

Figure 5:
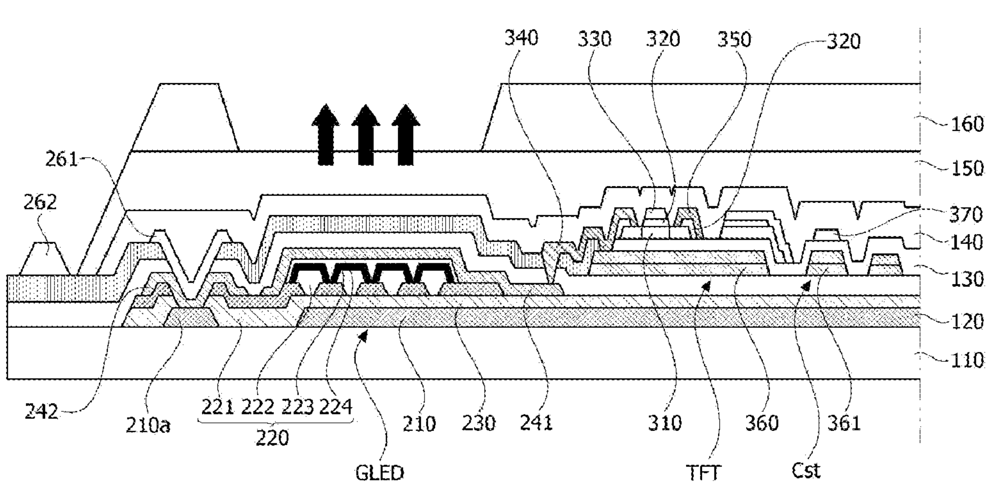
FIG. 5 is a conceptual diagram of a display device according to another embodiment of the present disclosure.

FIG. 5 is a conceptual diagram of a display device according to another embodiment of the present disclosure.

Referring to FIG. 5, a first electrode layer 210 may extend to a lower portion of a driving element TFT. With this configuration, the first electrode layer 210 may also serve as a light-blocking layer 360 of the driving element TFT. As a result, the light-blocking layer 360 may be partially omitted or selectively formed only on necessary portions.

In addition, a light-emitting element GLED may have different emission wavelengths for each sub-pixel. As an example, a first light-emitting element GLED may emit blue light, a second light-emitting element GLED may emit green light, and a third light-emitting element GLED may emit red light. In this case, a light conversion layer 410 and a color filter 420 may be omitted, which has the advantage of reducing the thickness of the overall panel. In addition, a first conductive semiconductor rod 222 of the light-emitting element GLED may be formed as a single layer or may be omitted. When the first conductive semiconductor rod 222 is omitted, a seed semiconductor layer 221 may serve as an n-type semiconductor layer.

Figure 6:
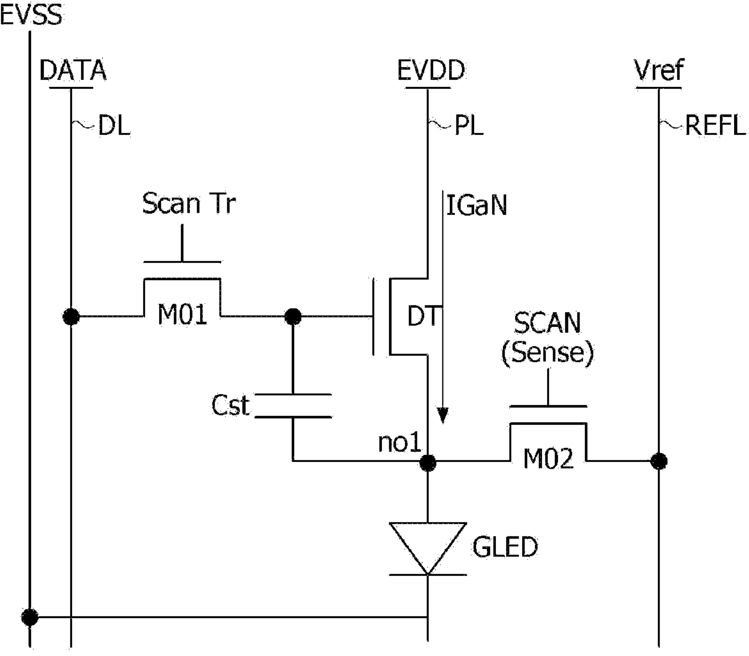
FIG. 6 is a diagram illustrating a circuit structure according to one embodiment of the present disclosure.

FIG. 6 is a diagram illustrating a circuit structure according to one embodiment of the present disclosure.

Due to a process variation caused in the manufacturing process of a display panel and an element characteristic variation, there may be a difference in electrical characteristics of the driving element between the sub-pixels, and such a difference may increase as the driving time of the pixels passes. In order to compensate for the electrical characteristic variation of the driving element between pixels, an internal compensation technique or external compensation technique may be applied to the organic light-emitting display device.

The internal compensation technique uses an internal compensation circuit implemented in each of the pixel circuits to sense a threshold voltage of the driving element for each sub-pixel and compensate for a gate-source voltage Vgs of the driving element by as much as the threshold voltage.

The external compensation technique uses an external compensation circuit to sense the current or voltage of the driving element, which changes according to the electrical characteristics of the driving element, in real-time. The external compensation technique is used to compensate for an electrical characteristic variation (or change) of the driving elements in the pixels in real-time by modulating pixel data (digital data) of an input image by as much as the electrical characteristic variation (or change) of the driving element sensed for each pixel.

Referring to FIG. 6, the pixel circuit includes a light-emitting element GLED, a first driving element DT configured to supply a current to the light-emitting element GLED, a switch element M01 configured to connect a data line DL in response to a scan pulse SCAN, and a capacitor Cst connected to a gate electrode 330 of the first driving element DT. In this pixel circuit, the first driving element DT and the switch element M01 may be implemented as n-channel transistors.

The switch element M01 is turned on according to a gate-on voltage of the scan pulse SCAN to connect the data line DL to the gate electrode 330 of the first driving element DT.

The first driving element DT includes a first electrode connected to an EVDD line PL to which a pixel driving voltage EVDD is applied, the gate electrode connected to the switch element M01 and the capacitor Cst, and a second electrode connected to the light-emitting element GLED. In addition, the first driving element DT drives the light-emitting element GLED by supplying a current to the light-emitting element GLED according to the gate-source voltage Vgs. Here, the light-emitting element GLED may be connected between the first driving element DT and an EVSS line. The light-emitting element GLED is turned on and emits light when a forward voltage between a cathode and an anode is greater than or equal to a threshold voltage.

The capacitor Cst is connected between the gate electrode and the second electrode of the first driving element DT and stores the gate-source voltage Vgs of the first driving element DT.

The pixel circuit may further include a second switch element M02 connected between a reference voltage line REFL and the second electrode of the first driving element DT. In this pixel circuit, the first driving element DT and the switch elements M01 and M02 may be implemented as n-channel transistors.

The second switch element M02 is turned on according to a gate-on voltage of the scan pulse SCAN or a sensing pulse SENSE to connect the reference voltage line REFL, through which a reference voltage Vref is applied, to the second electrode of the first driving element DT.

In a sensing mode, a current flowing through a channel of the first driving element DT or a voltage between the first driving element DT and the light-emitting element GLED may be sensed through the reference voltage line REFL. The current flowing through the reference voltage line REFL is converted into a voltage through an integrator and converted into digital data through an analog-to-digital converter (hereinafter referred to as "ADC"). This digital data is sensing data including information on the threshold voltage or mobility of the first driving element DT. The sensing data may be transmitted to a compensation unit of the display panel driving unit DIC. In addition, the compensation unit may receive the sensing data from the ADC and add or multiply a compensation value selected based on the sensing data to the pixel data to compensate for a deviation or variation in the threshold voltage of the first driving element DT.

Figure 7A:
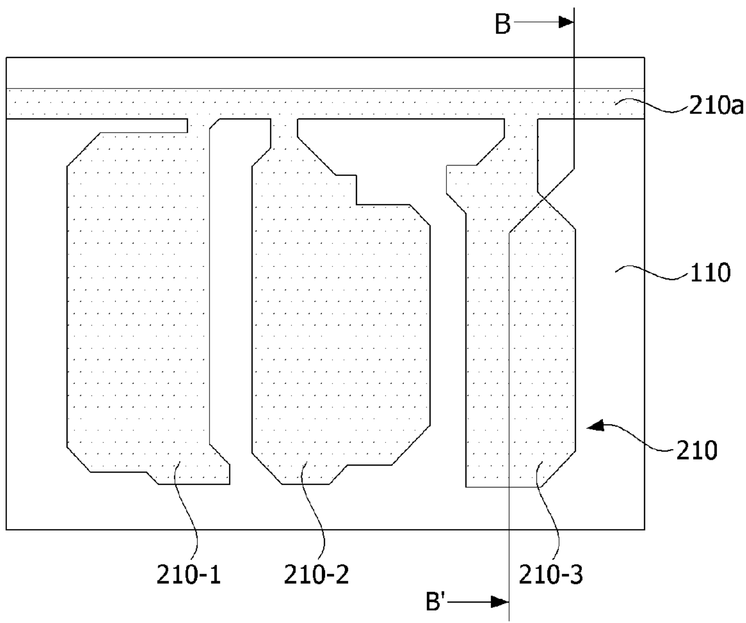
FIG. 7A is a plan view illustrating a state in which a first electrode layer is formed according to one embodiment of the present disclosure.
Figure 7B:
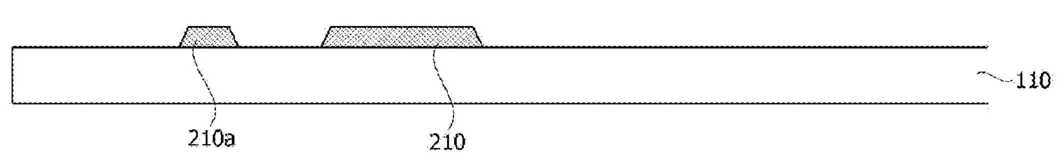
FIG. 7B is a cross-sectional view taken along line B-B' of FIG. 7A according to one embodiment of the present disclosure.

FIG. 7A is a plan view illustrating a state in which the first electrode layer is formed according to one embodiment. FIG. 7B is a cross-sectional view taken along line B-B' of FIG. 7A according to one embodiment.

Referring to FIGS. 7A and 7B, the first electrode layer 210 may be formed on the substrate 110. The first electrode layer 210 may include metals of various materials on which a semiconductor can be grown. As an example, the first electrode layer 210 may be made of Ti, but metals of various materials on which a semiconductor can be grown may be selected. The thickness of the first electrode layer 210 may range from 800 Å to 1500 Å, but the present disclosure is not necessarily limited thereto.

The first electrode layer 210 may have sub-unit electrode layers 210-1, 210-2, and 210-3 having different shapes. With this configuration, the overall color uniformity can be adjusted by differently controlling an emission area of each sub-pixel. Each of the sub-unit electrode layers 210-1, 210-2, and 210-3 is connected to an electrode line 210*a*, and the electrode line 210*a* may be connected to the low-potential line through the through electrode.

Figure 8A:
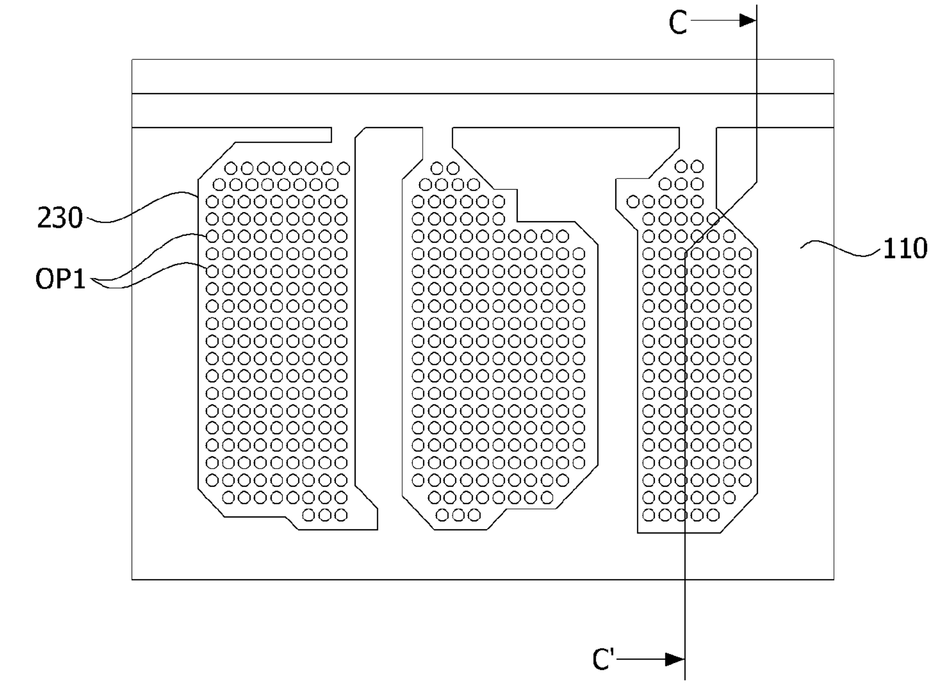
FIG. 8A is a plan view illustrating a state in which a seed semiconductor layer and a pattern insulating film are formed on the first electrode layer according to one embodiment of the present disclosure.
Figure 8B:
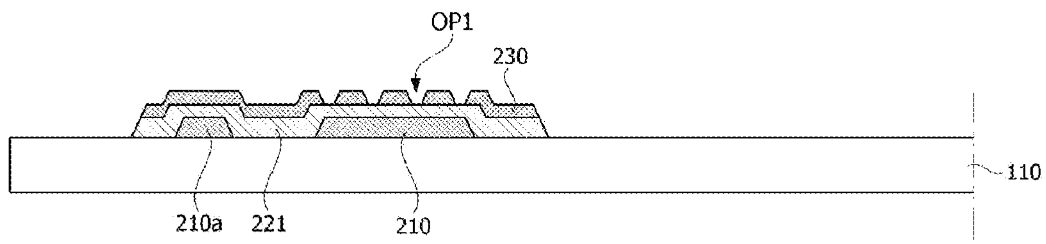
FIG. 8B is a cross-sectional view taken along line C-C' of FIG. 8A according to one embodiment of the present disclosure.

FIG. 8A is a plan view illustrating a state in which the seed semiconductor layer and the pattern insulating film are formed on the first electrode layer according to one embodiment. FIG. 8B is a cross-sectional view taken along line C-C' of FIG. 8A according to one embodiment.

Referring to FIGS. 8A and 8B, the seed semiconductor layer 221 may be epitaxially grown on the first electrode layer 210. A method of growing the semiconductor layer is not particularly limited. The semiconductor layer may be formed using a metal organic chemical vapor deposition (MOCVD) method, a chemical vapor deposition (CVD) method, a plasma chemical vapor deposition (PECVD) method, a molecular beam epitaxy (MBE) method, a hydride vapor phase epitaxy (HVPE) method, sputtering, and the like.

The seed semiconductor layer 221 may be made of a material selected from semiconductor materials having a composition formula of $In_xAl_yGa_{1-x-y}N$ (0<=x<=1, 0<=y<=1, and (<=x+y<=1), for example, a material selected from among GaN, AlGaN, InGaN, InAlGaN, and the like. The seed semiconductor layer 221 may be doped with an n-type dopant such as Si, Ge, Sn, Se, or Te, but the present disclosure is not limited thereto.

The pattern insulating film 230 may be disposed on the seed semiconductor layer 221. The pattern insulating film 230 includes the plurality of first holes OP1 exposing the seed semiconductor layer 221. The plurality of first holes OP1 may be formed by selectively etching the pattern insulating film 230 using a mask pattern. The pattern insulating film 230 may include an insulating material such as $SiO_2$ or $SiN_x$, but the present disclosure is not limited thereto.

The seed semiconductor layer 221 and the pattern insulating film 230 may be formed entirely on the substrate 110 and then patterned at the same time. Accordingly, the seed semiconductor layer 221 and the pattern insulating film 230 may have the same area on a plane.

Figure 9A:
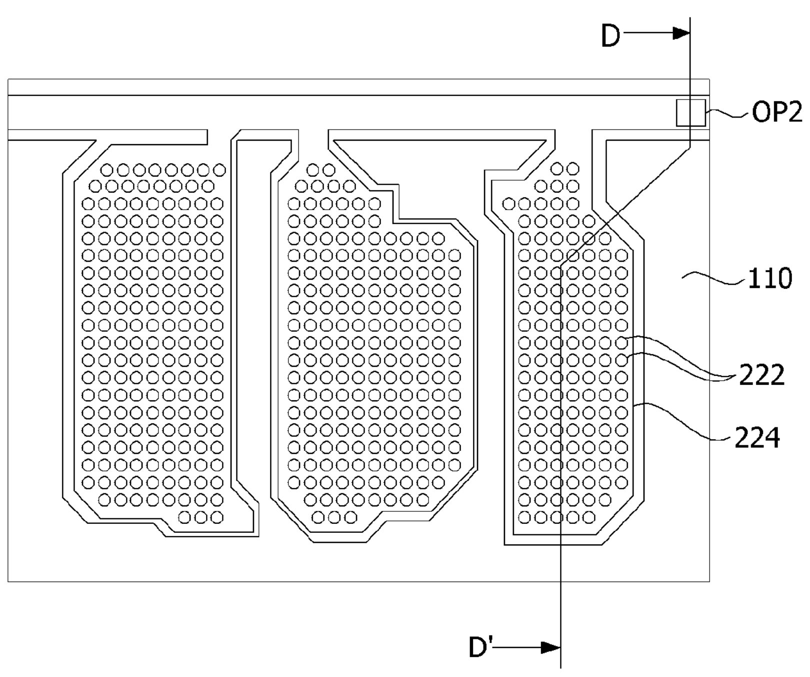
FIG. 9A is a plan view illustrating a state in which a first conductive semiconductor rod, an activation layer, and a second conductive semiconductor layer are formed on the pattern insulating film according to one embodiment of the present disclosure.
Figure 9B:
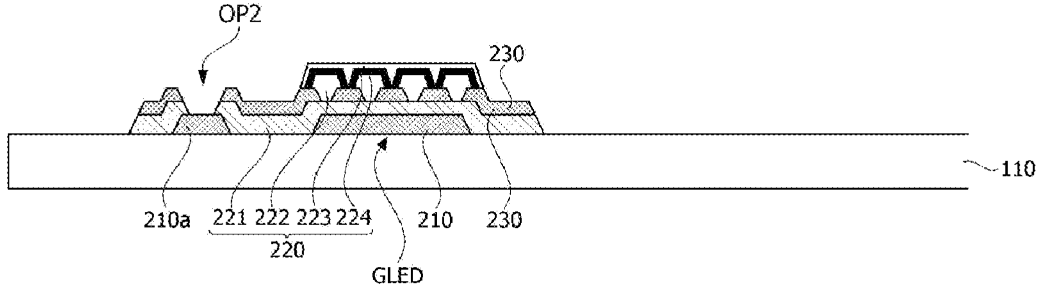
FIG. 9B is a cross-sectional view taken along line D-D' of FIG. 9A according to one embodiment of the present disclosure.

FIG. 9A is a plan view illustrating a state in which the first conductive semiconductor rod 222, the activation layer 223, and the second conductive semiconductor layer 224 are formed on a pattern insulating film according to one embodiment. FIG. 9B is a cross-sectional view taken along line D-D' of FIG. 9A according to one embodiment.

Referring to FIGS. 9A and 9B, the plurality of first conductive semiconductor rods 222 grow in the plurality of first holes OP1 in a substantially vertical direction, and may each have a nano-sized diameter. The first conductive semiconductor rod 222 may extend to an upper surface of the pattern insulating film 230 after being grown in the first hole OP1. At this time, a second hole OP2 for connecting the first electrode layer 210 to an external electrode pad may be formed.

A cross section of the first conductive semiconductor rod 222 may have a triangular shape, a quadrangular shape, a trapezoidal shape, or a pyramid shape. However, the shape of the first conductive semiconductor rod 222 is not particularly limited. The plurality of first conductive semiconductor rods 222 may be disposed to be spaced apart from each other, but are not necessarily limited thereto, and may form a single layer depending on growth conditions.

The first conductive semiconductor rod 222 may be a compound semiconductor such as a group III-V compound semiconductor, a group II-VI compound semiconductor, or the like, and may be doped with a first dopant.

The first conductive semiconductor rod 222 may be made of a material selected from semiconductor materials having a composition formula of $In_xAl_yGa_{1-x-y}N$ (0<=x<=1, 0<=y<=1, and (<=x+y<=1), for example, a material selected from among GaN, AlGaN, InGaN, InAlGaN, and the like. The first dopant may be an n-type dopant such as Si, Ge, Sn, Se, and Te. When the first dopant is an n-type dopant, the first conductive semiconductor rod 222 doped with the first dopant may be an n-type semiconductor.

The activation layer 223 is disposed on the first conductive semiconductor rod 222. Thus, the activation layer 223 may have a shape curved along an upper surface of the first conductive semiconductor rod 222. The activation layer 223 may be formed on each of the first conductive semiconductor rods 222 to be separated into a plurality of activation layers, or the activation layers 223 formed respectively on the plurality of first conductive semiconductor rods 222 may be connected to each other.

The activation layer 223 may transition to a low energy level due to the recombination of electrons and holes and emit light having a wavelength corresponding thereto. In the present embodiment, light of a blue wavelength band may be emitted, but the present disclosure is not necessarily limited thereto.

The activation layer 223 may have one structure among a single well structure, a multi-well structure, a single quantum well structure, a multi-quantum well (MQW) structure, a quantum dot structure, and a quantum wire structure, but the structure of the activation layer 223 is not limited thereto.

The activation layer 223 may have a structure in which a plurality of well layers and a plurality of barrier layers are alternately arranged. The well layer and the barrier layer may have a composition formula of $In_xAl_yGa_{1-x-y}N$ (0<=x<=1, 0<=y<=1, and 0<=x+y<=1), and an energy band gap of the barrier layer may be greater than the energy band gap of the well layer.

The second conductive semiconductor layer 224 is disposed on the activation layer 223. The second conductive semiconductor layer 224 may be implemented with a compound semiconductor such as a group III-V compound semiconductor, a group II-VI compound semiconductor, or the like and may be doped with a second dopant.

The second conductive semiconductor layer 224 may be formed of a semiconductor material having a composition formula of $In_xAl_yGa_{1-x-y}N$(0<=x<=1,0<=y<=1, and (<=x+y<=1), or a material selected from among GaN, AlGaN, InGaN, InAlGaN, and the like. When the second dopant is a p-type dopant such as Mg, Zn, Ca, Sr, Ba, or the like, the second conductive semiconductor layer 224 doped with the second dopant may be a p-type semiconductor.

Figure 10A:
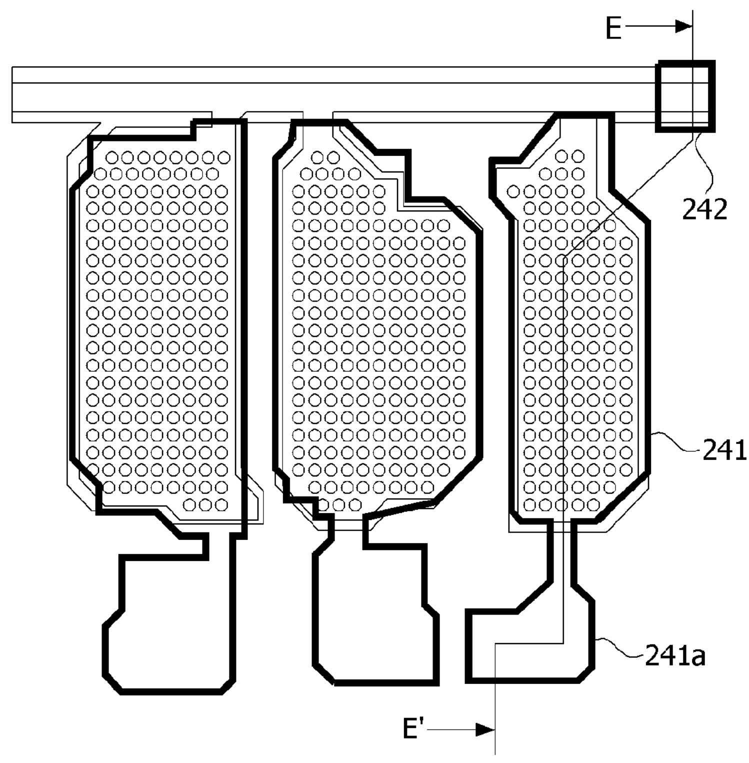
FIG. 10A is a plan view illustrating a state in which a second electrode layer is formed according to one embodiment of the present disclosure.
Figure 10B:
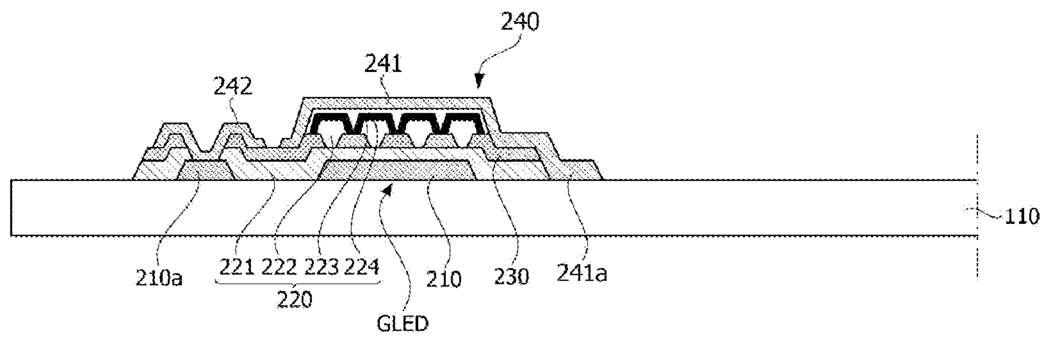
FIG. 10B is a cross-sectional view taken along line E-E' of FIG. 10A according to one embodiment of the present disclosure.

FIG. 10A is a plan view illustrating a state in which the second electrode layer 241 is formed according to one embodiment. FIG. 10B is a cross-sectional view taken along line E-E' of FIG. 10A according to one embodiment.

The second electrode layer 241 may be disposed on the light-emitting structure 220. The second electrode layer 241 may include a first connection node 241*a* extending to a side surface of the light-emitting structure 220. The second electrode layer 241 may be a transparent electrode such as ITO, but the present disclosure is not necessarily limited thereto.

The second electrode layer 241 may be formed by entirely forming an ITO layer 240 on the light-emitting structure 220 and the substrate 110 and then patterning the ITO layer 240. At this time, a second connection node 242 electrically connected to the electrode line 210*a* of the first electrode layer 210 may be formed on the second hole OP2.

Figure 11A:
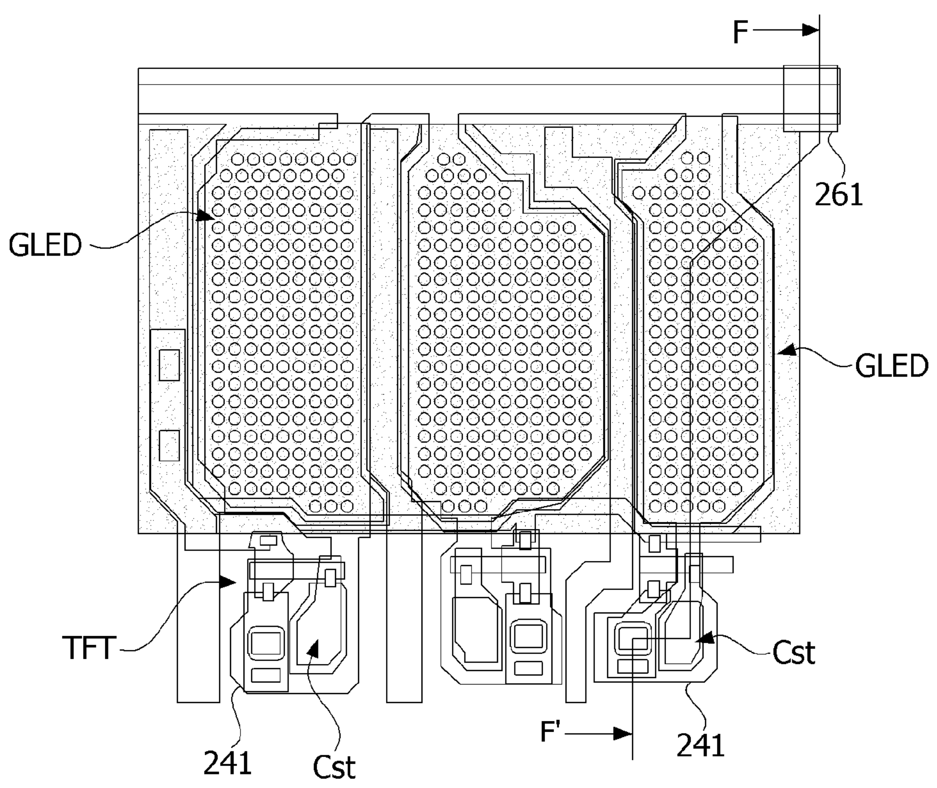
FIG. 11A is a view illustrating a state in which an active layer and a line electrode are formed on a first insulating layer according to one embodiment of the present disclosure.
Figure 11B:
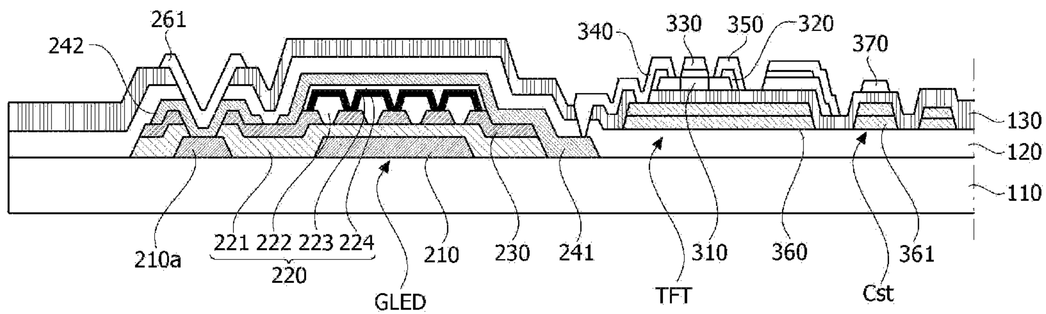
FIG. 11B is a cross-sectional view taken along line F-F' of FIG. 11A according to one embodiment of the present disclosure.
Figure 11C:
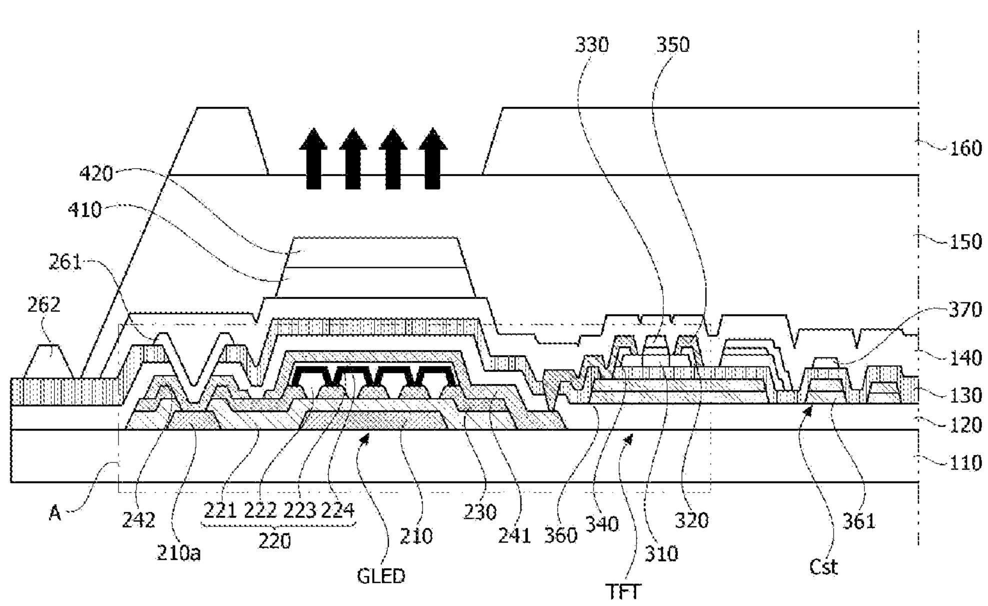
FIG. 11C is a view illustrating a state in which a light conversion layer and a color filter are formed according to one embodiment of the present disclosure.

FIG. 11A is a view illustrating a state in which the active layer and the line electrode are formed on the first insulating layer according to one embodiment. FIG. 11B is a cross-sectional view taken along line F-F' of FIG. 11A according to one embodiment. FIG. 11C is a view illustrating a state in which the light conversion layer and the color filter are formed.

Referring to FIGS. 11A to 11C, the light-blocking layer 360 may be formed by patterning a metal layer through a photolithography process. The light-blocking layer 360 may block external light so that the light is not irradiated to the active layer 310 of the driving element TFT, thereby preventing or at least reducing a photo current from generating in a pixel area. In addition, the light-blocking layer 360 may be connected to a second line electrode 340 to serve as a line.

The first interlayer insulating film 130 may be formed on the light-emitting element GLED and the light-blocking layer 360. The first interlayer insulating film 130 may include an insulating material such as an oxide film ($SiO_2$) or a nitride film ($SIN_x$), or may be formed of a multi-layered insulating film in which two or more oxide films ($SiO_2$) and nitride films ($SIN_x$) are stacked.

The active layer 310 may be made of a semiconductor material formed on the first interlayer insulating film 130 and may be patterned by a photolithography process. The active layer 310 may include an active pattern of each of TFTs of the pixel circuit and TFTs of the gate driving unit. A portion of the active layer 310 may be metallized by ion doping. The metallized portion may be used as a jumper pattern connecting the metal layers at some nodes of the pixel circuit to connect components of the pixel circuit.

The gate insulating film 320 may be formed on the active layer 310. The gate insulating film 320 may be made of an inorganic insulating material.

The gate electrode 330 and the upper electrode 370 of the storage capacitor Cst may be formed on the gate insulating film 320. The gate electrode 330 and the like may be patterned by a photolithography process.

The second line electrode 340 and the first line electrode 350 may extend outwardly from the active layer 310. The second line electrode 340 may include the first through electrode 340*a* that passes through the first interlayer insulating film 130 and the first insulating layer 120 and is electrically connected to the second electrode layer 241 through a first opening H1 of the light-emitting element GLED. In addition, the second line electrode 340 may include the second through electrode 340*b* that passes through the first interlayer insulating film 130 and is electrically connected to the light-blocking layer 360 through a second opening H2. In this case, the light-blocking layer 360 may serve as a line at the same time.

Referring to FIG. 11C, the second insulating layer 140 may be disposed on the driving element TFT, and the light conversion layer 410 may be disposed on the second insulating layer 140. The light conversion layer 410 according to the embodiment may include a fluorescent material capable of converting blue light emitted from the light-emitting element GLED into white light. As an example, the light conversion layer 410 may include a yttrium aluminum garnet (YAG) phosphor that converts blue light into white light, but is not necessarily limited thereto, and may include various fluorescent materials capable of converting emitted light into white light.

The color filter 420 may be disposed on the light conversion layer 410. The color filter 420 may convert the white light converted by the light conversion layer 410 into RGB light. As the configuration of the color filter 420, known configurations may be applied without limitation.

According to an embodiment, by using an inorganic light-emitting element, a lifespan, which is a disadvantage of the organic light-emitting element, can be improved. Accordingly, low-power driving can be enabled.

Further, inorganic light-emitting elements can be applied to the entire surface of a glass substrate, and thus it can be applied to models that require high luminance and high-resolution characteristics.

In addition, an aperture ratio can be maximized by applying red, green, and blue (RGB) sub-pixels, and pure-color luminance can be improved by not using white pixels.

In addition, costs can be reduced by omitting an expensive polarizing plate.

Effects of the present disclosure will not be limited to the above-mentioned effects and other unmentioned effects will be clearly understood by those skilled in the art from the following claims.

While the embodiments of the present disclosure have been described in detail above with reference to the accompanying drawings, the present disclosure is not necessarily limited to these embodiments, and various changes and modifications may be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by these embodiments. Accordingly, the above-described embodiments should be understood to be exemplary and not limiting in any aspect. The scope of the present disclosure should be construed by the appended claims, and all technical spirits within the scopes of their equivalents should be construed as being included in the scope of the present disclosure.

What is claimed is:

1. A display device comprising:

a substrate;

a light-emitting element on the substrate;

a first insulating layer on the light-emitting element; and a driving element on the first insulating layer, the driving element passing through the first insulating layer and is electrically connected to the light-emitting element, wherein the light-emitting element includes:

a first electrode layer on the substrate;

a seed semiconductor layer on the first electrode layer;

a pattern insulating film on the seed semiconductor layer, the pattern insulating film including a plurality of through holes;

a plurality of first conductive semiconductor rods in the plurality of through holes, respectively;

an activation layer on the plurality of first conductive semiconductor rods;

a second conductive semiconductor layer on the activation layer; and a second electrode layer on the second conductive semiconductor layer, wherein the second electrode layer includes a connection node extending to a side surface of the seed semiconductor layer and electrically connected to the driving element.

2. The display device of claim 1, wherein the seed semiconductor layer is epitaxially grown on the first electrode layer.

3. The display device of claim 1, wherein the driving element includes:

an active layer on the first insulating layer; and a first line electrode and a second line electrode that are connected to the active layer, the second line electrode passing through the first insulating layer and is electrically connected to the second electrode layer of the light-emitting element.

4. The display device of claim 3, wherein the active layer is higher than the activation layer.

5. The display device of claim 3, further comprising:

a light-blocking layer between the first insulating layer and the active layer.

6. The display device of claim 3, further comprising:
a light-blocking layer below the active layer and on a same layer as the first electrode layer.

7. The display device of claim 5, wherein the second line electrode is electrically connected to the light-blocking layer.

8. The display device of claim 1, further comprising:
a second insulating layer on the driving element; and
a light conversion layer on the second insulating layer, the light conversion layer above the light-emitting element and overlapping the light-emitting element.

9. The display device of claim 8, wherein the light-emitting element is at a position that is lower than the driving element, and the light conversion layer is at a position that is higher than the driving element.

10. The display device of claim 1, further comprising:
a connection channel that passes through the first insulating layer and electrically connects the first electrode layer to a low-potential line.

11. The display device of claim 8, further comprising:
a color filter on the light conversion layer,
a third insulting layer on the color filter, and
a black matrix on the third insulting layer,
wherein a remaining area except for an opening area from which a light is emitted by the light-emitting element is covered by the black matrix.

12. A display device comprising:
a substrate;
a light-emitting element on the substrate;
a first insulating layer on the light-emitting element;
a driving element on the first insulating layer;
a second insulating layer on the driving element; and
a light conversion layer on the second insulating layer, the light conversion layer overlapping the light-emitting element,
wherein the light-emitting element includes:
a first electrode layer on the substrate;
a seed semiconductor layer on the first electrode layer;
a pattern insulating film on the seed semiconductor layer, the pattern insulating film including a plurality of through holes;
a plurality of first conductive semiconductor rods in the plurality of through holes, respectively;
an activation layer on the plurality of first conductive semiconductor rods;
a second conductive semiconductor layer on the activation layer; and
a second electrode layer on the second conductive semiconductor layer,
wherein the second electrode layer includes a connection node extending to a side surface of the seed semiconductor layer and electrically connected to the driving element.

13. The display device of claim 12, wherein
the connection node is extended to an outside of the seed semiconductor layer and is disposed on the substrate.

14. The display device of claim 13, wherein the driving element includes:
an active layer on the first insulating layer; and
a first line electrode and a second line electrode that are connected to the active layer, the second line electrode passing through the first insulating layer and is electrically connected to a second electrode layer of the light-emitting element.

* * * * *